US009893692B2

(12) United States Patent
Soe et al.

(10) Patent No.: US 9,893,692 B2
(45) Date of Patent: Feb. 13, 2018

(54) HIGH LINEARLY WIGIG BASEBAND AMPLIFIER WITH CHANNEL SELECT FILTER

(71) Applicant: Tensorcom, Inc., Carlsbad, CA (US)

(72) Inventors: Zaw Soe, Encinitas, CA (US); Kevin Jing, San Diego, CA (US); Steve Gao, San Diego, CA (US)

(73) Assignee: Tensorcom, Inc., Carlsbad, CA (US)

( * ) Notice: Subject to any disclaimer, the term of this patent is extended or adjusted under 35 U.S.C. 154(b) by 0 days.

(21) Appl. No.: 15/352,877

(22) Filed: Nov. 16, 2016

(65) Prior Publication Data

US 2017/0141746 A1    May 18, 2017

Related U.S. Application Data

(60) Provisional application No. 62/256,460, filed on Nov. 17, 2015.

(51) Int. Cl.
H03G 1/00    (2006.01)
H03F 3/45    (2006.01)
H03G 5/28    (2006.01)

(52) U.S. Cl.
CPC ......... *H03G 1/007* (2013.01); *H03F 3/45197* (2013.01); *H03G 5/28* (2013.01); *H03F 2200/165* (2013.01); *H03F 2200/69* (2013.01); *H03F 2203/45372* (2013.01); *H03F 2203/45374* (2013.01); *H03F 2203/45512* (2013.01); *H03F 2203/45544* (2013.01); *H03F 2203/45594* (2013.01); *H03F 2203/45686* (2013.01); *H03F 2203/45702* (2013.01)

(58) Field of Classification Search
USPC ......................................... 330/252–261, 288
See application file for complete search history.

(56) References Cited

U.S. PATENT DOCUMENTS 4,352,073 A    9/1982    Leuthold
4,442,410 A    4/1984    Daniel
(Continued)

FOREIGN PATENT DOCUMENTS

EP    1219054    12/2004
WO    2011107159    9/2011

OTHER PUBLICATIONS

Chen, M; Wang, K H; Zhao, D; Dai, L; Soe, Z; Rogers, P. "A CMOS Bluetooth Radio Transceiver Using a Sliding-IF Architecture", IEEE 2003 Custom Integrated Circuits Conference, pp. 455-458.
(Continued)

*Primary Examiner* — Hieu Nguyen
(74) *Attorney, Agent, or Firm* — Steven J Shattil

(57) ABSTRACT

A circuit comprises a Sallen-Key filter, which includes a source follower that implements a unity-gain amplifier; and a programmable-gain amplifier coupled to the Sallen-Key filter. The circuit enables programmable gain via adjustment to a current mirror copying ratio in the programmable-gain amplifier, which decouples the bandwidth of the circuit from its gain settings. The programmable-gain amplifier can comprise a differential voltage-to-current converter, a current mirror pair, and programmable output gain stages. The Sallen-Key filter and at least one branch in the programmable-gain amplifier can comprise transistors arranged in identical circuit configurations.

16 Claims, 3 Drawing Sheets

(56) References Cited

U.S. PATENT DOCUMENTS

| | | |
|---|---|---|
| 4,843,341 A | 6/1989 | Hosticka et al. |
| 4,851,714 A | 7/1989 | Hwang |
| 5,264,736 A | 11/1993 | Jacobson |
| 5,361,041 A | 11/1994 | Lish |
| 5,396,128 A | 3/1995 | Dunning |
| 5,464,984 A | 11/1995 | Cox et al. |
| 5,589,783 A | 12/1996 | McClure |
| 5,959,504 A | 9/1999 | Wang |
| 6,057,714 A | 5/2000 | Andrys et al. |
| 6,426,658 B1 | 7/2002 | Mueller et al. |
| 6,570,450 B2 | 5/2003 | Nilson et al. |
| 6,590,430 B2 | 7/2003 | Sendelweck |
| 6,646,508 B1 | 11/2003 | Barbetta |
| 6,801,090 B1 | 10/2004 | Abernathy |
| 6,937,071 B1 | 8/2005 | Moraveji |
| 6,980,055 B2 | 12/2005 | Gharpurey |
| 7,088,142 B2 | 8/2006 | Koto |
| 7,181,180 B1 | 2/2007 | Teo et al. |
| 7,471,140 B2 | 12/2008 | Salerno |
| 7,486,145 B2 | 2/2009 | Floyd et al. |
| 7,528,656 B2 | 5/2009 | Lee et al. |
| 7,760,014 B2 | 7/2010 | Ohannaidh |
| 7,897,484 B2 | 3/2011 | Kar-Roy et al. |
| 7,936,217 B2 | 5/2011 | Dang et al. |
| 8,004,361 B2 | 8/2011 | Lin |
| 8,031,002 B2 | 10/2011 | Jo et al. |
| 8,135,055 B2 | 3/2012 | Kohlmann |
| 8,138,835 B2 | 3/2012 | Zeng et al. |
| 8,278,918 B2 | 10/2012 | McAdam |
| 8,368,461 B2 * | 2/2013 | Blanc .............. H03H 11/04 327/552 |
| 8,487,695 B2 * | 7/2013 | Soe .............. H03F 3/195 327/562 |
| 8,724,679 B2 | 5/2014 | Lakkis |
| 2003/0132797 A1 | 7/2003 | Mohieldin et al. |
| 2005/0206412 A1 | 9/2005 | Moraveji |
| 2005/0237107 A1 | 10/2005 | Onody |
| 2007/0090877 A1 | 4/2007 | Bagheri |
| 2007/0115086 A1 | 5/2007 | Molins |
| 2008/0204129 A1 | 8/2008 | Le et al. |
| 2008/0233893 A1 | 9/2008 | Duperray |
| 2010/0013557 A1 | 1/2010 | Cao |
| 2010/0039092 A1 | 2/2010 | Cordier |
| 2010/0120369 A1 | 5/2010 | Ko |
| 2010/0124891 A1 | 5/2010 | Lin et al. |
| 2011/0075715 A1 | 3/2011 | Kravitz |
| 2011/0218755 A1 | 9/2011 | Dhayni |
| 2012/0019314 A1 | 1/2012 | Shih et al. |
| 2012/0319673 A1 | 12/2012 | Tham et al. |
| 2013/0076434 A1 | 3/2013 | Soe |
| 2013/0285746 A1 | 10/2013 | Soe |
| 2014/0035667 A1 | 2/2014 | Soe |

OTHER PUBLICATIONS

47 CFR § 15.255 Operation within the band 57-64 GHz no date.

Wikipedia, "Sallen-Key topology", http://en.wikipedia.org/wiki/Sallen-Key_topology, Copied [Oct. 6, 2011 5:35:09 PM], pp. 1-8.

* cited by examiner

HIGH LINEARLY WIGIG BASEBAND AMPLIFIER WITH CHANNEL SELECT FILTER

CROSS REFERENCE TO RELATED APPLICATIONS

This application claims the benefit of priority to U.S. provisional application 62/256,460 filed Nov. 17, 2015. This and all other extrinsic references referenced herein are incorporated by reference in their entirety.

FIELD OF THE INVENTION

The invention relates generally to circuits that comprise filters and programmable-gain amplifiers, and specifically, to circuits that provide independent filter bandwidth control and gain.

BACKGROUND

The background description includes information that may be useful in understanding the present invention. It is not an admission that any of the information provided herein is prior art or relevant to the presently claimed invention, or that any publication specifically or implicitly referenced is prior art.

The performance requirements of a WiGig baseband signal-processing system are three-fold. Based on input signal levels, it is desirable to generate sufficient gain for maximum signal-to-noise (SNR) ratio at the baseband output. It is also desirable to attenuate out-of-band signals with respect to a specified rejection level and be able to accommodate input signals that have a high dynamic range while maintaining high linearity.

FIG. 1 is a diagram of a baseband system in which a filter function is realized with a first dedicated amplifier in a closed-loop configuration coupled to a second dedicated amplifier configured to provide programmable gain. The first stage is a Sallen-Key filter, which has a large input impedance and a small output impedance. The input to the filter is via resistor $R_1$, whose output is coupled to resistor $R_2$ and capacitor $C_3$, which couples to the output $V_{out}$. Resistor $R_2$ is coupled to capacitor $C_4$ (which is grounded) and the positive input of the operational amplifier. The output $V_{out}$ is directly coupled to the negative input of the operational amplifier to function as a unity-gain buffer. The operational amplifier offers high gain and allows the construction of a second-order filter without the use of inductors. In this case, the impedances depicted in this Sallen-Key filter provide a low pass filter. These filters can be designed as low-pass, high-pass, or band-pass filters. The second stage provides adjustable gain via the adjustable impedances $R_{adj(1)}$ and $R_{adj(2)}$ depicted in FIG. 1.

SUMMARY

The following description includes information that may be useful in understanding the present invention. It is not an admission that any of the information provided herein is prior art or relevant to the presently claimed invention, or that any publication specifically or implicitly referenced is prior art.

In one aspect of the disclosure, a circuit comprises a Sallen-Key filter and a programmable-gain amplifier coupled thereto. The Sallen-Key filter comprises a source follower that implements a unity-gain amplifier. The programmable-gain amplifier is configured to provide programmable gain via adjustment to a current mirror copying ratio in the programmable-gain amplifier to decouple bandwidth of the circuit from its gain settings. The programmable-gain amplifier can comprise a differential voltage-to-current converter, a current mirror pair, and programmable output gain stages. In some aspects, the circuit is configured to function as a low-pass filter, a high-pass filter, or a band-pass filter.

In another aspect, a circuit comprises a Sallen-Key filter coupled to a programmable-gain amplifier, wherein the circuit comprises a source follower inside the Sallen-Key filter comprising a first plurality of transistors arranged in a first circuit configuration; and at least one branch within the programmable-gain amplifier comprising at least a second plurality of transistors arranged in at least a second circuit configuration, the at least second circuit configuration identical to the first circuit configuration. In some aspects, the first and the at least second plurality of transistors have the same unit device sizes and current densities. The circuit may have a fabrication layout that comprises a uniform array of unit devices. Methods for making this circuit and other circuits are disclosed herein.

Another aspect provides a method for avoiding linearity dependence on the operating region of transistors in an amplifier in a Sallen-Key filter. The method comprises employing a source follower in the Sallen-Key filter to provide unity gain, the source follower comprising an active device and a load device; and selecting a Direct Current (DC) level of an input signal to the Sallen-Key filter to ensure adequate headroom of at least one of the load device and devices in a current-mirror pair employed as a programmable amplifier.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain aspects herein is intended merely to better illuminate the present work and does not pose a limitation on the scope of the invention otherwise claimed. No language in the specification should be construed as indicating any non-claimed element essential to the practice of the invention.

Groupings of alternative elements or aspects of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

BRIEF DESCRIPTION OF THE DRAWINGS

Flow charts depicting disclosed methods comprise "processing blocks" or "steps" may represent computer software instructions or groups of instructions. Alternatively, the processing blocks or steps may represent steps performed by functionally equivalent circuits, such as a digital signal processor or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present disclosure. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied. Unless otherwise stated, the steps described below are unordered, meaning that the steps can be performed in any convenient or desirable order.

DETAILED DESCRIPTION

The detailed description set forth below in connection with the appended drawings is intended as a description of various aspects of the present work and is not intended to represent the only aspects in which the present work may be practiced. The detailed description includes specific details for the purpose of providing a thorough understanding of the present work. However, it will be apparent to those skilled in the art that the present work may be practiced without these specific details. In some instances, well known structures and components are shown in block diagram form in order to avoid obscuring the concepts of the present work.

Where each aspect of the disclosure might represent a single combination of inventive elements, the present work is considered to include all possible combinations of the disclosed elements. Thus if one aspect comprises elements A, B, and C, and a second aspect comprises elements B and D, then the present work is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 2:
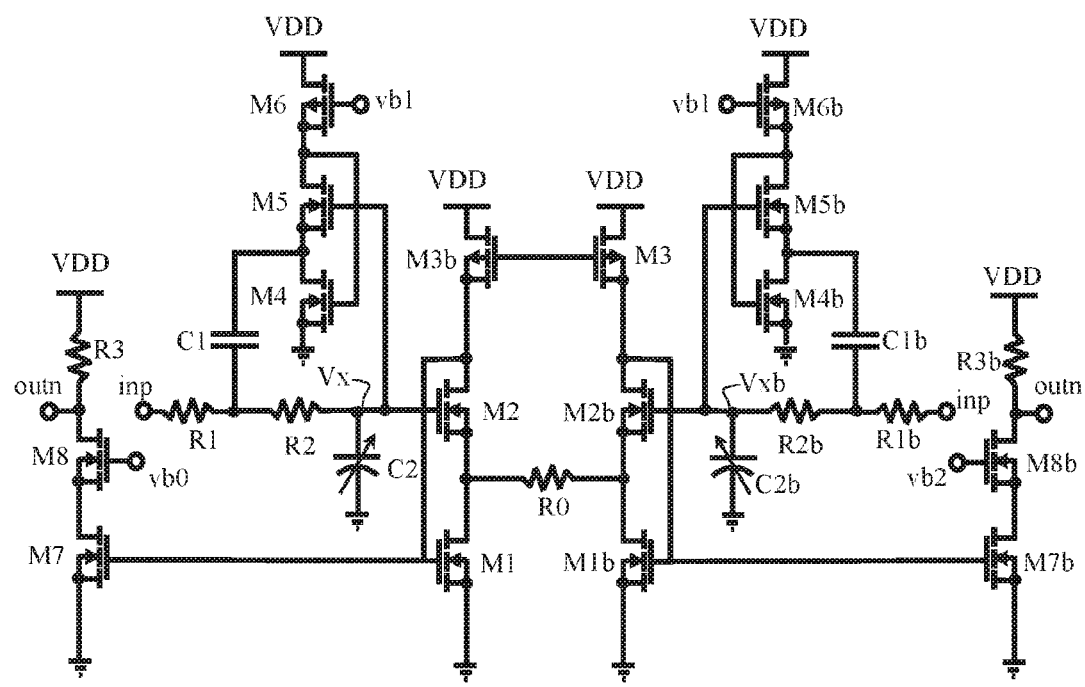
FIG. 2 is a circuit diagram depicting a filter and amplifier configured in accordance with one aspect of the invention.

FIG. 2 is a circuit diagram depicting a filter and amplifier configured in accordance with one aspect of the invention. A pair of signal input nodes (inp) and a pair of signal output nodes (outn) are provided. Transistors (such as field effect transistors) are denoted by M1-M8 and M1b-M8b. Resistors are denoted by R0, R1-R3, and R1b-R3b. Capacitors are denoted by C1, C2, C1b, and C2b. The capacitances of C2 and C2b can be adjustable (e.g., programmable). Power supply voltages, transistor base voltages, and ground are indicated via symbols commonly used in the art.

In the circuit configuration depicted in FIG. 2, M2, M2b, M5, and M5b provide source-follower functionality. A source-follower amplifier comprises two series stacked devices coupled between supply voltage VDD and Ground, wherein a first device (i.e., the active device) translates the input signal while the second device (i.e., the load device) provides a load. The load device is biased by a DC bias voltage. The source-follower's output signal is in phase with the input signal, and the voltage gain is approximately 0 dB and behaves linearly.

The low power-supply voltages employed in integrated circuits restrict the voltage headroom (i.e., the available output signal swing). To alleviate the headroom problem, an active current source load can be used. For example, the load device can provide a controlled current load to the active device, which is driven by an input. Thus, the load device provides a DC bias to operate the source follower.

Figure 1:
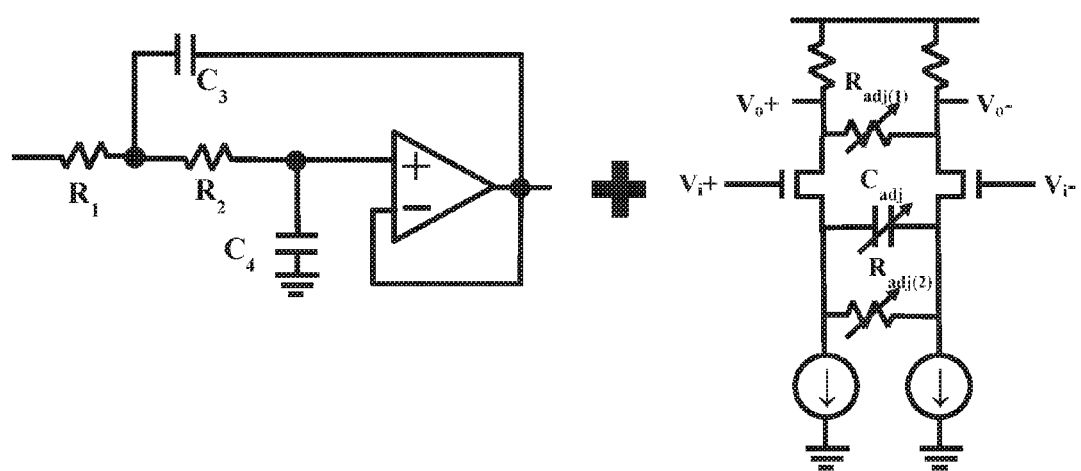
FIG. 1 is a block diagram of a circuit in which a filter function is realized with a first dedicated amplifier in a closed-loop configuration coupled to a second dedicated amplifier configured to provide programmable gain.

The components, R1, R2, C1, C2, and M5 function as a Sallen-Key filter. Thus, in accordance with one aspect of the disclosure, the source follower is incorporated into the design of the Sallen-Key filter. The operational amplifier in the conventional Sallen-Key filter in FIG. 1 limits the high frequency behavior of the filter and usually results in high power consumption. The source follower can significantly extend the range of the high frequency behavior of this filter while achieving lower power consumption. This source follower has input/output characteristics similar to that of the operational amplifier. The operational amplifier presents infinite input impedance, good current drive and a small output impedance at its input and output terminals. Similarly, the source follower has attributes that include having a high input impedance, good current drive and a low output impedance at its input and output terminals.

The components, M2, M2b, and R0 convert the differential voltage between the voltages Vx and Vxb depicted in the circuit diagram to a differential current through transistors M1 and M1b. The transistor pairs M1, M7 and M1b, M7b provide current mirror pairs with gain equal to the device ratio between M7 and M1. The components M7 and R3 form a first output gain stage, and components M7b and R3b form a second output gain stage, wherein the first and second output gain stages convert input differential current to output differential voltages.

The overall differential gain of input signal is:

$$Av = \frac{vout}{vin} = \frac{R_3}{R_0}\frac{W_7}{W_1}$$

The filter transfer function is:

$$H(\omega) = \frac{\omega_0^2}{s^2 + \frac{\omega_0}{Q}s + \omega_0^2}$$

wherein $$\omega_0 = \frac{1}{\sqrt{R_1 R_2 C_1 C_2}}, \text{ and } \frac{\omega_0}{Q} = \frac{1}{C_1}\left(\frac{1}{R_1} + \frac{1}{R_2}\right).$$

In accordance with some aspects of the disclosure, circuits disclosed herein can be employed in baseband processing of wide-bandwidth signals, such as those used in the WiGig standard. Such aspects can reduce power consumption compared to conventional circuits. For example, the closed loop bandwidth of the amplifier in a conventional Sallen-Key filter needs to be commensurate with the filter bandwidth. This ordinarily demands high power consumption, especially in the case of WiGig signals. However, in aspects disclosed herein, unity gain is achieved by the source follower.

In some aspects of the disclosure, improved linearity can be achieved. In conventional Sallen-Key filter designs, linearity depends on the operating region of transistors in the amplifier of the filter. The ideal operating region of those transistors is saturation in which sufficient drain-to-source voltage presents. For large large input signals, transistor headroom is reduced. Thus, amplifier open loop gain is reduced and the assumption that amplifier closed loop gain being unity breaks, which causes linearity to degrade.

In some aspects of the disclosure, since the source follower (M5 and M5b) in the Sallen-Key filter provides unity gain, the only headroom concerns are limited to transistors M4 and M4b, which can easily be addressed by setting the input to a higher DC level. Similarly, for the programmable-gain amplifier, when the input is set to a sufficiently high DC level, enough headroom can be guaranteed for transistors M1 and M7, which makes current copying from M1 to M7 immune to the input signal level. At the output, with the transistor M8 working as a cascade device, the headroom can be mildly squeezed without affecting current copying (and thus, linearity).

The circuit shown in FIG. 2 can provide independent filter bandwidth and gain control. In conventional filter-amplifier circuits, the bandwidth of the programmable-gain amplifier is also a function of the gain settings. In order to have independent bandwidth and gain controls (i.e. bandwidth controlled only through the Sallen-Key filter while gain is controlled only through the programmable-gain amplifier), the bandwidth of the programmable-gain amplifier has to be large enough for the worst-case gain setting to avoid affecting the overall bandwidth, leading to a sub-optimal design that results in high power consumption. To the contrary, in the circuit shown in FIG. 2, programmable gain can be achieved by the current mirror copying ratio (W7/W1) and resistor ratio (R3/R0). This enables high bandwidth without significant power consumption. Thus, in accordance with certain aspects of the disclosure, independent filter bandwidth and gain control can be achieved without increasing the power-consumption budget.

Circuit designs in accordance with certain aspects of the disclosure can facilitate fabrication of circuits comprising a Sallen-Key filter coupled with a programmable gain amplifier. The similarity in circuit structure between the amplifier inside the Sallen-Key filter and the programmable gain amplifier (e.g., branch M6, M5, M4, branch M3b, M2, M1, and branch M8, M7) can be exploited to facilitate layout, simplify design, reduce fabrication costs, and/or improve chip function. By sizing transistors to provide for a common unit device size and current density, the layout can be made highly compact and provide uniform arrays of unit devices that can mitigate certain layout-dependent effects. Accordingly, aspects of the disclosure include design and fabrication of integrated circuits, which can include methods, apparatuses, and programmable control systems configured to manufacture integrated circuits in accordance with the design aspects disclosed herein.

While FIG. 2 illustrates a low-pass implementation of a circuit, the novel aspects disclosed herein can be employed in alternative circuit configurations and can be adapted for any of the various types of filter characteristics that may be desirable for baseband, intermediate-frequency, and/or radio frequency processing.

By way of example, a high-pass implementation can be provided by replacing R1, R2, R1b, and R2b with capacitors, and C1, C2, C1b, and C2b with resistors. The resulting high-pass bandwidth is $$\omega_0 = 2\pi \cdot f_0 = \frac{1}{\sqrt{R_1 R_2 C_1 C_2}}.$$

In another aspect, a band-pass application can be achieved by cascading a high-pass filter with a low-pass filter. For example, an AC coupling capacitor can be followed by the depicted low-pass filter implementation. It will be apparent to those skilled in the art that alternative filter designs and applications of these and related circuits can be provided in accordance with the teachings disclosed herein.

Biasing current from M6, M6b, M3 and M3b will impact circuit performance. A large bias current will allow devices M5 and M2 to have large transconductance $g_m$, which reduces output impedance of the source follower stage for unity gain. However, excessively large bias current usually results in a larger device size for a given current density. This can cause a large capacitive load at the Sallen-Key filter output, as well as at the output of source follower M2, resulting in reduced bandwidth. Therefore, circuits designed in accordance with aspects of the disclosed herein can account for such tradeoffs, such as to produce a circuit with an optimal design with respect to the aforementioned parameters.

Figures 3, 4:
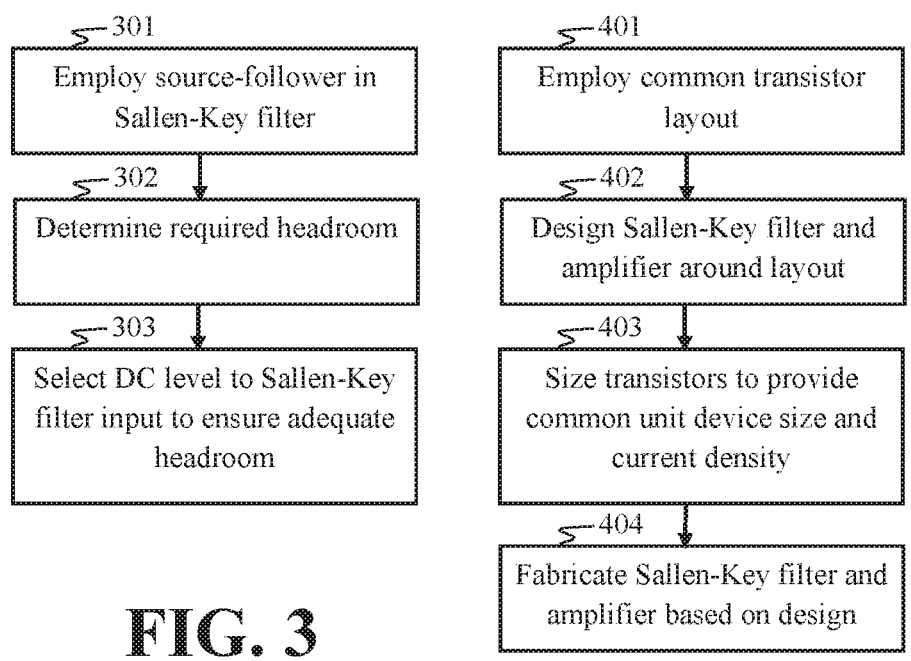
FIG. 3 is a flow chart that illustrates steps of a method performed in accordance with an aspect of the invention.
FIG. 4 is a flow chart that illustrates steps of a method performed in accordance with an aspect of the invention.

FIG. 3 is a flow diagram that depicts steps that can be performed in accordance with aspects of the disclosure. These steps can comprise a method for avoiding linearity dependence on the operating region of transistors in an amplifier in a Sallen-Key filter. A first step 301 comprises employing a source follower in a Sallen-Key filter. The source follower comprises an active device and a load device, and can provide unity gain. A second step 302 comprises determining required headroom in at least one of the transistors of a filter-amplifier circuit, such as the load device and devices in a current-mirror pair employed as a programmable amplifier. A third step 303 comprises selecting a DC level of an input signal to the Sallen-Key filter to ensure adequate headroom in the at least one transistor.

FIG. 4 is a flow diagram that depicts a method configured in accordance with an aspect of the disclosure. As noted above with respect to FIG. 2, the similarity in circuit structure between the amplifier inside the Sallen-Key filter and the programmable gain amplifier (e.g., branch M6, M5, M4, branch M3b, M2, M1, and branch M8, M7) can be exploited to facilitate layout, simplify design, reduce fabrication costs, and/or improve chip function.

A first step 401 in a method for fabrication of an integrated circuit comprises employing a transistor layout that is to be common to a Sallen-Key filter and at least a programmable-gain amplifier. A second step 402 comprises designing the Sallen-Key filter and the programmable-gain amplifier (and, optionally, other circuits and/or circuit portions) to include the transistor layout. This can provide for generating a circuit design for the Sallen-Key filter and the programmable-gain amplifier. A third step 403, which can optionally precede Step 402, comprises sizing the transistors in the layout to provide for a common unit device size and current density. Steps 402 and/or 403 can further comprise designing the layout to be made highly compact and provide uniform arrays of unit devices that can mitigate layout-dependent effects. Based on the generated circuit design, the Sallen-Key filter and the programmable-gain amplifier are fabricated 404.

Methods configured in accordance with some aspects of the disclosure can provide for the design of integrated circuits in accordance with the circuit configurations disclosed herein. In some aspects, methods are configured to provide for fabrication of integrated circuits in accordance with the designs disclosed herein. Method disclosed herein can comprise programmable systems configured to design and/or manufacture integrated circuits in accordance with the aforementioned design aspects.

It should be noted that any language directed to a method could be performed by any suitable combination of computing devices, including servers, interfaces, systems, databases, agents, peers, engines, modules, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as disclosed herein with respect to the disclosed circuits and methods.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

The invention claimed is:

1. A circuit comprising:
a Sallen-Key filter comprising a source follower that implements a unity-gain amplifier; and
a programmable-gain amplifier coupled to the Sallen-Key filter, the circuit configured to provide programmable gain via adjustment to a current mirror copying ratio in the programmable-gain amplifier to decouple bandwidth of the circuit from its gain settings.

2. The circuit recited in claim 1, wherein the programmable-gain amplifier comprises a differential voltage-to-current converter, a current mirror pair, and programmable output gain stages.

3. The circuit recited in claim 1, configured to function as at least one of a low-pass filter, a high-pass filter, and a band-pass filter.

4. The circuit recited in claim 1, wherein the source follower comprises a first plurality of transistors arranged in a first circuit configuration, and at least one branch within the programmable-gain amplifier comprises at least a second plurality of transistors arranged in at least a second circuit configuration, the at least second circuit configuration identical to the first circuit configuration.

5. The circuit recited in claim 4, wherein the first and the at least second plurality of transistors have the same unit device sizes and current densities.

6. The circuit recited in claim 1, comprising a fabrication layout that comprises a uniform array of unit devices.

7. A method for avoiding linearity dependence on operating region of transistors in an amplifier in a Sallen-Key filter, comprising:
employing a source follower in the Sallen-Key filter to provide unity gain, the source follower comprising an active device and a load device; and
selecting a DC level of an input signal to the Sallen-Key filter to ensure adequate headroom of at least one of the load device and devices in a current-mirror pair employed as a programmable-gain amplifier.

8. The method recited in claim 7, wherein the programmable-gain amplifier comprises a differential voltage-to-current converter and programmable output gain stages.

9. The method recited in claim 7, wherein the Sallen-Key filter is configured to function as at least one of a low-pass filter, a high-pass filter, and a band-pass filter.

10. The method recited in claim 7, wherein the source follower comprises a first plurality of transistors arranged in a first circuit configuration, and at least one branch within the programmable-gain amplifier comprises at least a second plurality of transistors arranged in at least a second circuit configuration, the at least second circuit configuration identical to the first circuit configuration.

11. The method recited in claim 10, wherein the first and the at least second plurality of transistors have the same unit device sizes and current densities.

12. The method recited in claim 10, wherein each of the source follower and the programmable-gain amplifier comprises a fabrication layout comprising a uniform array of unit devices.

13. A method for fabricating an integrated circuit, comprising:
designing a transistor layout comprising an array of unit devices, the transistor layout to be common to a Sallen-Key filter and at least a programmable-gain amplifier;
sizing the transistors in the transistor layout to provide for a common unit device size and current density;
generating a design of the Sallen-Key filter and the programmable-gain amplifier to each include the transistor layout; and
fabricating the Sallen-Key filter and the programmable-gain amplifier based on the design.

14. The method recited in claim 13, comprising designing the transistor layout to achieve compactness and provide uniform arrays of unit devices.

15. The method recited in claim 13, wherein the programmable-gain amplifier comprises a differential voltage-to-current converter, a current mirror pair, and programmable output gain stages.

16. The method recited in claim 13, wherein the integrated circuit is configured to function as at least one of a low-pass filter, a high-pass filter, and a band-pass filter.

* * * * *